United States Patent
De Berti et al.

(10) Patent No.: US 10,298,245 B1
(45) Date of Patent: May 21, 2019

(54) AUDIO ANALOG-TO-DIGITAL CONVERTER SYSTEMS AND METHODS

(71) Applicant: SYNAPTICS INCORPORATED, San Jose, CA (US)

(72) Inventors: Claudio De Berti, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/924,087

(22) Filed: Mar. 16, 2018

(51) Int. Cl.
 *H03M 1/00* (2006.01)

(52) U.S. Cl.
 CPC ................................ *H03M 1/002* (2013.01)

(58) Field of Classification Search
 CPC ........ H03M 1/002; H03M 3/454; H03M 3/43; H03M 3/368; H03M 3/424; G10L 21/0208; G10L 2021/02165; H04R 3/005; H04R 2410/07; G11B 20/24; H03F 3/4545
 USPC ....................................................... 381/94.1
 See application file for complete search history.

(56) References Cited

U.S. PATENT DOCUMENTS

| | | | |
|---|---|---|---|
| 6,404,367 B1 | 6/2002 | Van der Zwan et al. | |
| 7,057,540 B2* | 6/2006 | Muhammad | H03M 3/47 341/143 |
| 7,626,527 B1 | 12/2009 | Wang et al. | |
| 7,924,194 B2 | 4/2011 | Kumar | |
| 8,842,030 B1 | 9/2014 | Fontaine et al. | |
| 9,306,594 B2 | 4/2016 | Aboushady et al. | |
| 2008/0309536 A1* | 12/2008 | Le Guillou | H03M 3/346 341/143 |
| 2016/0134300 A1* | 5/2016 | Wang | H03M 1/0854 341/172 |

OTHER PUBLICATIONS

C. De Berti, "Continuous-Time ΣΔ Modulator for MEMS Microphones", Università Degli Studi Di Pavia, 2015, pp. 1-104.
P. Jelodarian et al., "A Current-mode Continuous-time Sigma-delta Modulator based on Translinear Loop Principle", Int'l. Scholarly and Scientific Research & Innovation, vol. 4, No. 6, 2010, pp. 943-946.

* cited by examiner

*Primary Examiner* — Ahmad F. Matar
*Assistant Examiner* — Sabrina Diaz
(74) *Attorney, Agent, or Firm* — Haynes and Boone, LLP

(57) ABSTRACT

An analog-to-digital conversion (ADC) system includes a transconductance amplifier, loop filter, quantizer, logic circuit, and digital-to-analog converter (DAC). The transconductance amplifier is configured to generate a current signal in response to an audio signal. The loop filter is connected to the transconductance amplifier and configured to generate a filtered signal based on the current signal. The quantizer is configured to generate a digital representation of the filtered signal. The logic circuit is configured to generate control signals based on the digital representation. The DAC is coupled to the loop filter's and the transconductance amplifier's output. The DAC includes three-level unit elements, where each unit element is configured to provide one of two signal levels or no signal to the loop filter in response to control signals from the logic circuit. Such an ADC system may allow for a high dynamic range while maintaining low power consumption and low noise.

20 Claims, 6 Drawing Sheets

AUDIO ANALOG-TO-DIGITAL CONVERTER SYSTEMS AND METHODS

TECHNICAL FIELD

The present application, in accordance with one or more embodiments, relates generally to audio processing and, more particularly, for example, to audio analog-to-digital converter systems and methods.

BACKGROUND

Signal processing systems, and in particular systems incorporating low power audio devices such as smartphones, tablets, and portable playback devices, have driven a need in the art for high-performance audio analog-to-digital converter (ADC) structures that achieve high dynamic range with low power consumption.

SUMMARY

In accordance with various embodiments further discussed herein, audio ADC systems and methods are provided. Such systems and methods may provide architectures that allow for a high dynamic range while maintaining low power consumption and low noise. In some aspects, a continuous-time sigma-delta (CTSD or CTΣΔ) ADC architecture may be utilized.

In one or more embodiments, an analog-to-digital conversion system includes a transconductance amplifier, a loop filter, a quantizer, a logic circuit, and a digital-to-analog converter. The transconductance amplifier is configured to generate a current signal in response to an audio signal. The loop filter is connected to the transconductance amplifier. The loop filter is configured to receive the current signal and generate a filtered signal based on the current signal. The quantizer is configured to generate a digital representation of the filtered signal. The logic circuit is configured to generate control signals based on the digital representation. The digital-to-analog converter is coupled to a capacitor of the loop filter and an output of the transconductance amplifier. The digital-to-analog converter includes a plurality of three-level unit elements, where each of the plurality of unit elements is configured to provide one of two signal levels or no signal to the loop filter in response to at least one of the control signals from the logic circuit.

In one or more embodiments, a method includes generating, by a transconductance amplifier, a first current signal in response to an audio signal received from an audio input device. The method further includes generating, by a loop filter, a filtered signal based on the first current signal. The method further includes generating, by a quantizer, a digital representation of the filtered signal. The method further includes generating, by a logic circuit, control signals based on the digital representation. The method further includes generating, by a digital-to-analog converter, a second current signal based on the control signals. Each of a plurality of three-level unit elements provides one of two current levels or no current to the loop filter in response to at least one of the control signals. The digital-to-analog converter is coupled to a capacitor of the loop filter and an output of the transconductance amplifier. The method further includes providing the second current signal to the loop filter.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Figure 1:
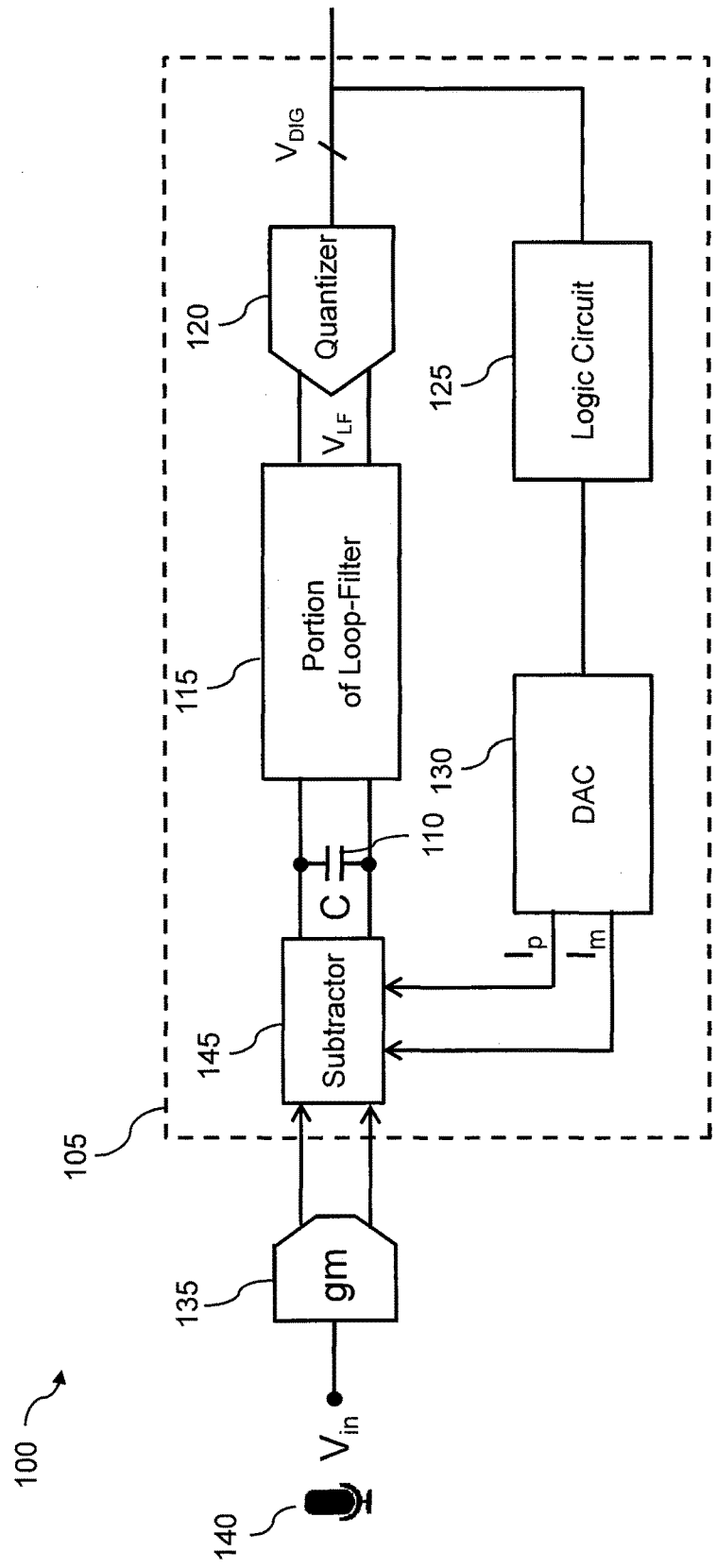
FIG. 1 illustrates a block diagram of an audio processing system for facilitating analog-to-digital conversion in accordance with one or more embodiments.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided herein to provide an audio analog-to-digital conversion. In some embodiments, ADC architectures are provided that may allow for a high dynamic range while maintaining low power consumption and low noise. Such ADC architectures may be particularly well-suited for audio systems and systems incorporating low power audio devices, such as those found in smartphones and tablets. In some aspects, a continuous-time sigma-delta (CTSD or CTΣΔ) ADC architecture may be utilized. As used herein, ADC may refer to analog-to-digital conversion or an analog-to-digital converter.

The ADC may include a forward path with a loop filter (or portion thereof) and a forward-path ADC (e.g., also referred to as a quantizer, a forward-path quantizer, or an ADC), and a feedback path with a logic circuit and a digital-to-analog converter (DAC) (e.g., also referred to as a feedback DAC). In some aspects, the ADC may receive an analog signal (e.g., an audio analog signal) via a transconductance amplifier connected to the ADC. In this regard, the ADC may receive its analog input from the transconductance amplifier. In some cases, the transconductance amplifier can be utilized as a part of an integrator (e.g., a first integrator) of the ADC and may thus be considered part of the loop filter of the ADC. For example, the transconductance amplifier together with a capacitor of the ADC may form a first integrator of the ADC. In an embodiment, the transconductance amplifier may be, may include, or may be a part of, a microphone programmable gain amplifier (MIC PGA). The ADC may include three-level unit elements in its feedback DAC, such that each unit element of the DAC may be set to provide a positive signal (e.g., positive current), a negative signal (e.g., negative current), or no signal (e.g., zero current). The unit elements of the DAC may be operated based on control signals from the logic circuit. More generally, each unit element selects from a first signal level (e.g., positive signal level), a second signal level (e.g., negative level), or a third signal level (e.g., no signal, zero signal level) and provides a signal (e.g., current signal) having the selected signal level (e.g., to the loop filter). In this regard, in some cases, providing no signal may be considered as providing a signal of a zero signal level.

Various components of the ADC may be provided such that their noise contribution may be considered non-dominant compared to a noise contribution of the transconductance amplifier. In an embodiment, utilization of the transconductance amplifier as a portion of an integrator of the ADC's loop filter and three-level elements in the feedback DAC may allow for a noise contribution generally associated with low power operation of such ADC architectures (e.g., CTSD ADC architectures in some cases) to be decreased when a small signal (e.g., small power signal) is processed, thus allowing higher dynamic range (DR) without increasing power consumption. In an aspect, a passive component (e.g., a capacitor) may be utilized to mitigate noise contribution of active elements of the loop filter. For example, in some cases, a capacitor of a first integrator of the ADC's loop filter may be utilized to mitigate noise contribution from the rest of the loop filter. The rest of the loop filter may accordingly be designed for stability and not for noise constraint, thus saving power. In some cases, a number of bits of the forward-path quantizer may be selected such that an associated jitter noise of the quantizer is not dominant over the transconductance amplifier's noise contribution. Thus, using various embodiments, the DR of the ADC is affected by the noise contribution of the transconductance amplifier, while other potential noise contributions that may limit DR, such as from the loop filter, quantizer, and/or feedback DAC, are mitigated. It is noted that such noise is generally less of an issue for conventional devices configured for higher power operation. In some cases, for a given dynamic range specification, various embodiments may allow power operation that is around one order of magnitude lower than in conventional implementations at a same technology node.

FIG. 1 illustrates a block diagram of an audio processing system 100 for facilitating analog-to-digital conversion in accordance with one or more embodiments. Not all of the depicted components may be required, however, and one or more embodiments may include additional components not shown in the figure. Variations in the arrangement and type of the components may be made without departing from the scope of the claims as set forth herein, including additional components, different components, and/or fewer components.

The audio processing system 100 includes an ADC 105. The ADC 105 includes a capacitor 110, a portion 115 of a loop filter, a quantizer 120, a logic circuit 125, a DAC 130 with three-level elements, and a subtractor 145. The audio processing system 100 also includes a transconductance amplifier 135 to receive an analog signal $V_{in}$ (e.g., an analog audio signal, an analog voltage signal) from an audio input device, such as a microphone 140. In an aspect, the transconductance amplifier 135 may be implemented with programmable gain and may thus referred be to as a PGA or Gm-based PGA. When the audio input device is a microphone, the transconductance amplifier 135 may be referred to as a microphone PGA or MIC PGA.

The transconductance amplifier 135 may generate a current signal (e.g., also referred to simply as a current) based on the analog signal $V_{in}$ and provide the current signal to the subtractor 145. In some cases, as shown for example in FIG. 1, the current signal may be a differential current provided to the subtractor 145. The subtractor 145 may also receive an output signal from the DAC 130. In this regard, the subtractor 145 may generate a difference between the differential current (e.g., also referred to as input current) provided by the transconductance amplifier 135 and the output signal (e.g., also referred to as DAC current or feedback current) provided by the DAC 130. For example, in the current domain, a differentiator may be realized by shorting the input current and the DAC current before providing to a remainder of the loop filter (e.g., the capacitor 110 and onwards).

The transconductance amplifier 135 and the capacitor 110 (e.g., also referred to as a differential capacitor) may form an integrator of the loop filter of the ADC 105. In some cases, the loop filter may include a cascade of integrators, with the transconductance amplifier 135 and the capacitor 110 forming a first integrator of the loop filter. The loop filter may provide filtering (e.g., also referred to as noise shaping) of a difference between the differential current associated with the analog signal $V_{in}$ and the output signal from the DAC 130 (e.g., the difference being provided by the subtractor 145) to suppress quantization noise, with higher-order loop filters associated with more noise shaping and lower stability. The capacitor 110 may filter a noise of a remainder of the loop filter, represented by the portion 115 of the loop filter, thus mitigating noise contribution of the loop filter. For example, the capacitor 110 may be utilized to integrate the difference in the input and DAC currents and mitigate noise contribution of active elements of the loop filter. As such, in an aspect, the portion 115 of the loop filter may be designed primarily for stability rather than noise constraint, thus saving power.

The loop filter collectively provided by the transconductance amplifier 135, subtractor 145, capacitor 110, and the portion 115 may perform noise shaping on the analog signal $V_{in}$ and provide a resulting filtered analog signal $V_{LF}$ to the quantizer 120 (e.g., also referred to as an ADC). The quantizer 120 may receive the filtered analog signal $V_{LF}$ and generate an N-bit digital signal (denoted as $V_{DIG}$) that is a digital representation of the filtered analog signal $V_{LF}$. The quantizer 120 may provide the N-bit digital signal $V_{DIG}$ to the logic circuit 125. In some cases, the quantizer 120 may also provide the N-bit digital signal $V_{DIG}$ for storage and/or processing (e.g., by one or more components outside of the ADC 105). For example, the quantizer 120 may be coupled to one or more digital filters, such as a decimation filter.

In an embodiment, the quantizer 120 may be a multibit, mid-tread quantizer. In some cases, the number of bits utilized by the quantizer 120 may be selected such that jitter noise (e.g., associated with a clock for facilitating operation of the quantizer 120) does not dominate over a noise associated with the transconductance amplifier 135. In some cases, the quantizer 120 may allow for more noise shaping to be applied and reduced sensitivity to clock jitter. The mid-tread characteristic of the quantizer 120 may facilitate three-level control of the three-level elements of the DAC 130. The mid-tread characteristic of the quantizer 120 may allow a zero level at an output of the quantizer 120. In a case with a zero level output, the DAC 130 (e.g., feedback DAC) may provide null output noise (e.g., associated with null output currents). In some cases, such combination of the mid-tread characteristic and feedback may allow noise contribution of the feedback to be negligible when processing signals, such as when processing small signals.

The logic circuit 125 may receive the N-bit digital signal $V_{DIG}$ from the quantizer 120 and generate, using a control signal generator of the logic circuit 125, control signals for the DAC 130 based on the N-bit digital signal $V_{DIG}$. The control signals may control the three-level unit elements of the DAC 130. In some aspects, the DAC 130 includes a current steering (CS) DAC with three-level unit elements. In such aspects, for each three-level unit element, the unit element can be positively selected (e.g., to provide positive charge to the capacitor 110), negatively selected (e.g., to provide negative charge to the capacitor 110), or not selected (e.g., to provide zero charge to the capacitor 110). In this regard, the control signals from the logic circuit 125 may cause some unit elements of the DAC 130 to provide positive charge, negative charge, or no charge to the capacitor 110. Current from the unit elements of the DAC 130 may be combined by a combiner circuit (not shown) of the DAC 130 to provide currents (e.g., differential currents) on output lines $I_p$ and $I_m$ to the subtractor 145. The current signal from the DAC 130 may be combined with the current signal from the transconductance amplifier 135. The combined current signal may be provided through the forward and feedback path of the ADC 105. For example, the combining may be performed by the subtractor 145 to subtract the current signal from the DAC 130 (e.g., the DAC current) with the current signal from the transconductance amplifier 135 (e.g., the input current). The capacitor 110 may receive a difference between the current signals from the DAC 130 and the current signals from the transconductance amplifier 135.

In some aspects, the logic circuit 125 may include one or more dynamic element matching (DEM) circuits. The DEM circuit(s) may operate to randomize mismatched components of the analog elements (e.g., three-level unit elements) of the DAC 130. For example, the DEM circuit(s) may be implemented using a scrambler that randomly (e.g., pseudo-randomly) directs different bits of the N-bit digital signal $V_{DIG}$ from the quantizer 120 to different unit elements of the DAC 130 at different times (e.g., shuffles the signal) to effectively cancel out the effects of component mismatch of the unit elements on the signal. Canceling the effects of component mismatch may increase dynamic range. The control signal generator of the logic circuit 125 may generate control signals for the DAC 130 based on the shuffled signal. In some cases, the matching may be utilized to mitigate imperfections in the unit elements, since the unit elements may not match exactly (e.g., due to imperfections in manufacturing). Such mismatches may contribute distortion (e.g., harmonic distortion) and noise and lower dynamic range.

Alternatively or in addition, the logic circuit 125 may include a data segmentation circuit that splits the N-bit digital signal $V_{DIG}$ from the quantizer 120 into multiple data segments. Each data segment may be associated with a respective group of unit elements, such that the data segment causes unit elements within its associated group to provide positive current, negative current, or no current to the capacitor 110. In some cases, the DEM circuit may scramble each data segment and the control signal generator may generate respective control signals (e.g., for corresponding unit elements of the DAC 130) for each scrambled data segment. In some cases, data segmentation may be utilized to reduce DEM complexity, such as for higher values of N.

Quantization noise and small signals may be expressed within plus-or-minus one least significant bit (LSB) of the N-bit digital signal $V_{DIG}$, and therefore noise contribution of the DAC 130 can be negligible relative to the noise associated with the transconductance amplifier 135. In this regard, in some cases, when a level of the N-bit digital signal $V_{DIG}$ is +LSB or −LSB, only one of the unit elements of the DAC 130 is connected to the capacitor 110 to provides a differential current on the output lines $I_p$ and $I_m$, with other unit elements not providing current (e.g., providing zero current). In a case of a unit element providing zero current, noise is not contributed by the unit element as no noise (e.g., no current) is injected into the loop filter of the ADC 105 by the unit element. In some cases, the number of unit elements in the DAC 130 may be (M−1)/2, where M may be the number of quantization levels provided by the DAC 130. In some cases, $M=2^N$.

Thus, using various embodiments, the dynamic range of the ADC 105 is affected by the noise contribution of the transconductance amplifier 135, while other potential noise contributions that may limit dynamic range, such as from the loop filter, quantizer 120, and/or DAC 130, are mitigated. In some cases, the ADC 105 may provide higher dynamic range while allowing operation with low noise and low power. In an embodiment, the ADC 105 may be referred to as exhibiting a sigma-delta (ΣΔ or SD) ADC architecture. In some aspects, the ADC 105 may be utilized for continuous time operation, and thus may be referred to as exhibiting a CT ΣΔ ADC architecture or CT SD ADC.

Figure 2:
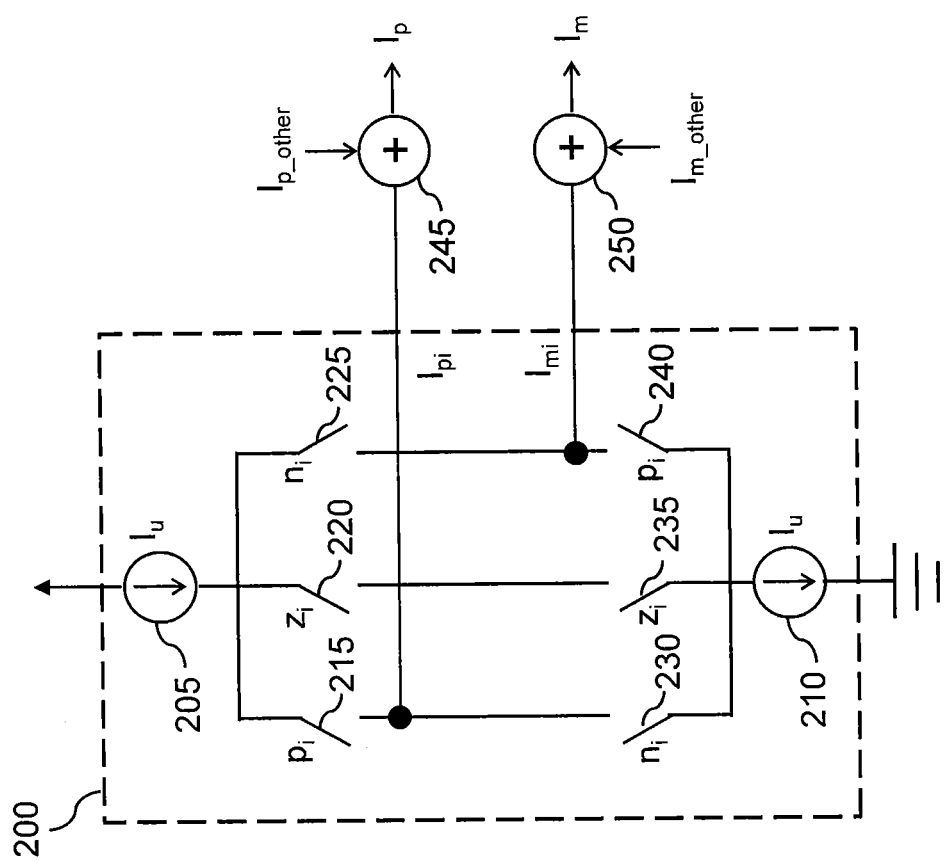
FIG. 2 illustrates an example of a unit element in accordance with one or more embodiments.

FIG. 2 illustrates an example of a unit element 200 in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components. In an embodiment, the unit element 200 may be, may include, or may be a part of, a unit element of the DAC 130 of FIG. 1. In this regard, the unit element 200 may be an $i^{th}$ unit element of the DAC 130. The DAC 130 may include a number of unit elements appropriate to generate an analog signal based on the N-bit digital output $V_{DIG}$ of the quantizer 120.

The unit element 200 includes unit current sources 205 and 210 and switches 215, 220, 225, 230, 235, and 240. Control signals $p_i$, $z_i$, and $n_i$ may be generated by a logic circuit (e.g., 125) and provided to the unit element 200. The switches 215 and 240 may be controlled by the control signal $p_i$, switches 220 and 235 may be controlled by the control signal $z_i$, and switches 225 and 230 may be controlled by the control signal $n_i$. When the $p_i$ control signal is asserted (e.g., set to logic high), the switches 215 and 240 are closed and a current $+I_u$ is provided to an output line $I_{pi}$ of the unit element 200 and a current $-I_u$ is provided on an output line $I_{mi}$ of the unit element 200. When the $n_i$ control signal is asserted, the switches 225 and 230 are closed and a current $-I_u$ is provided to the output line $I_{pi}$ of the unit element 200 and a current $+I_u$ is provided to the output line $I_{mi}$ of the unit element 200. When the $z_i$ control signal is asserted, the switches 220 and 235 are closed and zero current is provided on the output lines $I_{pi}$ and $I_{mi}$ of the unit element 200. Depending on type of switching technology utilized, the switches 215, 220, 225, 230, 235, and 240 may turn on or off in response to a logic high control signal and turn off or on in response to a logic low control signal.

With reference to FIG. 1, current provided by respective output lines $I_{pn}$ (for n=0, 1, . . . , i, etc.) of the different unit elements of the DAC 130 may be combined by one or more combiner circuits to provide a combined current on an output line $I_p$ of the DAC 130. Similarly, current provided by respective output lines $I_{mn}$ of the different unit elements of the DAC 130 may be combined by one or more combiner circuits to provide a combined current on an output line $I_m$ of the DAC 130. In FIG. 2, a combiner circuit 245 combines the current on the output line $I_{pi}$ of the unit element 200 with current on the output line $I_{pn}$ for other unit elements (e.g., collectively denoted as $I_{p\_other}$), and a combiner circuit 250 combines the current on the output line $I_{mi}$ of the unit element 200 with current on the output line $I_{mn}$ for other unit elements (e.g., collectively denoted as $I_{m\_other}$). The currents on the output lines $I_p$ and $I_m$ are coupled to the capacitor 110 of the ADC 105.

In an aspect, different unit elements may have different weights. For example, the unit element 200 may be set to have a unity weight and thus provide $-I_u$, $+I_u$, or zero current on the output lines $I_{pi}$ and/or $I_{mi}$. Another unit element (e.g., a $k^{th}$ unit element) of the DAC 130 may be set to have a weight of four and thus provide $-4I_u$, $+4I_u$, or zero current on its output lines $I_{pk}$ and/or $I_{mk}$. In some cases, the logic circuit 125 may split the N-bit digital output $V_{DIG}$ into different segments, with each segment being associated with a respective weight or respective set of weights.

Figure 3:
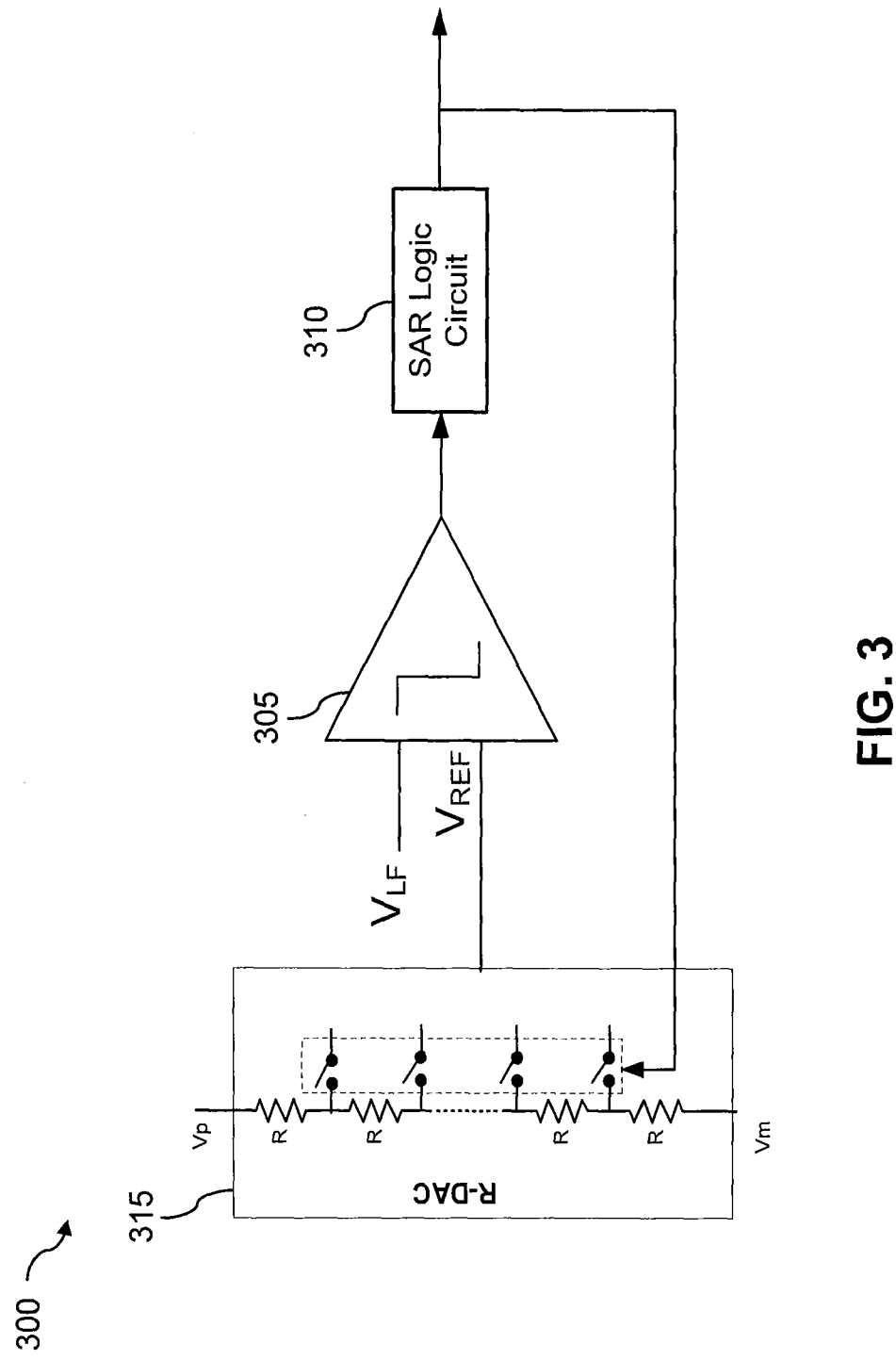
FIG. 3 illustrates an example of a quantizer in accordance with one or more embodiments of the present disclosure.

FIG. 3 illustrates an example of a quantizer 300 in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components. In an embodiment, the quantizer 300 may be, may include, or may be a part of, the quantizer 120 of FIG. 1.

The quantizer 300 includes a comparator 305, successive-approximation-register (SAR) logic circuit 310, and reference voltage generator 315. The reference voltage generator 315 includes a resistive-ladder (e.g., also referred to as a resistive string) to generate voltage references for the comparator 305. The resistive-ladder may provide monotonicity and linearity. The quantizer 300 may also include timing circuitry to generate and/or receive clock signals and sample-hold circuitry to facilitate operation of the quantizer 300.

In an embodiment, the quantizer 300 is an N-bit, mid-tread quantizer. As an example, the quantizer 300 may be an 8-bit quantizer. In some cases, the quantizer 300 may be an asynchronous quantizer (e.g., an asynchronous 8-bit SAR ADC). Initially, the SAR logic circuit 310 may set an N-bit sequence (e.g., a predetermined N-bit sequence) as a control signal to control operation of the reference voltage generator 315 using the set N-bit sequence. Different N-bit sequences are associated with different reference voltages. The comparator 305 receives an output $V_{LF}$ of a loop filter and a reference voltage $V_{REF}$ from the reference voltage generator 315 and generates a comparator output based on a difference between $V_{LF}$ and $V_{REF}$. The comparator output may be indicative of whether $V_{LF}$ or $V_{REF}$ is larger. The SAR logic circuit 310 receives the comparator output and accordingly sets the control signal to configure the reference voltage generator 315. The process of generating a comparator output based on a comparison of $V_{LF}$ and $V_{REF}$ and setting a control signal to effectuate a reference voltage may be repeated iteratively to allow convergence toward a digital representation of the output $V_{LF}$.

As one example of operating the quantizer 300, the SAR logic circuit 310 may generate 8-bit sequences (e.g., also referred to as 8-bit codes). The bit sequence may be represented as seven bits $b_7 b_6 b_5 b_4 b_3 b_2 b_1 b_0$, with $b_7$ being the most significant bit (MSB) and $b_0$ being the LSB. Initially, the SAR logic circuit 310 may set a control signal to a code 10000000 and provide this code to the reference voltage generator 315 to close and open appropriate switches to cause generation of a reference voltage associated with the code 10000000. When $V_{LF} > V_{REF}$, the SAR logic circuit 310 may maintain the MSB at 1 and set a next bit $b_6$ to 1, such that the next code provided to the reference voltage generator 315 is 11000000. The reference voltage generator 315 may generate a reference voltage associated with the code 11000000. When $V_{LF} < V_{REF}$, the SAR logic circuit 310 may set the MSB at 0 and set a next bit $b_6$ to 1, such that the next code provided to the reference voltage generator 315 is 01000000. The reference voltage generator 315 may generate a reference voltage associated with the code 01000000. Such a process may be repeated iteratively to allow convergence toward a digital representation of the output $V_{LF}$.

Once convergence is reached, the SAR logic circuit 310 may provide an N-bit representation of the output $V_{LF}$ as an output of the quantizer 300. In some cases, the architecture of the quantizer 300 may be associated with low quantization noise and a relaxed clock jitter specification. With reference to FIG. 1, the N-bit representation of the loop filter output $V_{LF}$ is denoted as $V_{DIG}$. Although the quantizer 300 utilizes a resistive-ladder to generate voltage references for the comparator 305, other manners by which to generate voltage references can be used alternative or in addition to the resistive-ladder. Depending on application, different types of quantizers may be utilized as part of a forward path of the ADC 105. In some cases, the SAR-based quantizer may be smaller and have higher efficiency than other ADCs, such as flash ADCs. Since the quantizer 300 is part of a loop (e.g., forward loop) of the ADC 105, an offset associated with the comparator 305 may generally be mitigated.

Figure 4:
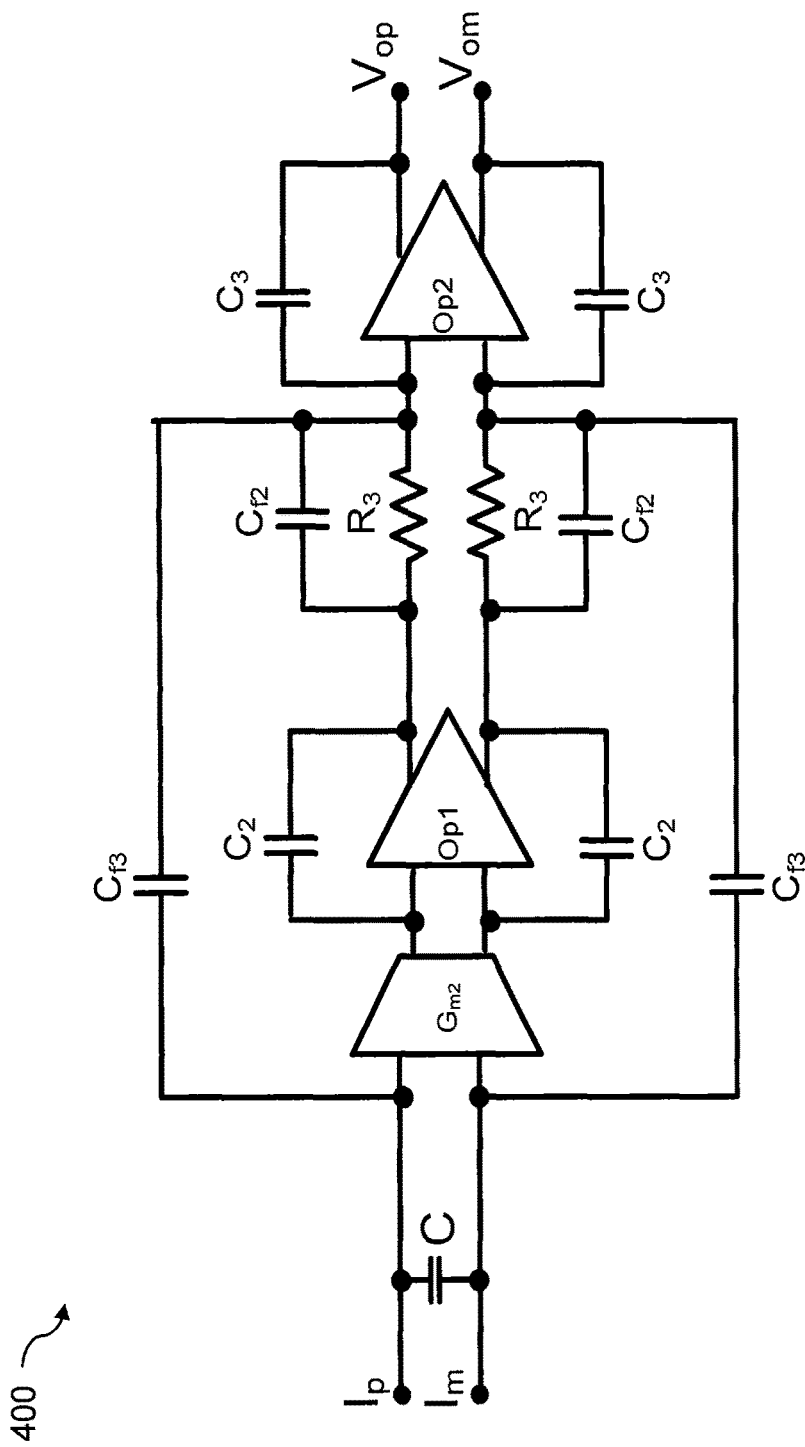
FIG. 4 illustrates an example of a loop filter in accordance with one or more embodiments of the present disclosure.

FIG. 4 illustrates an example of a loop filter 400 in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components.

In an embodiment, the loop filter 400 may be, may include, or may be a part of, the capacitor 110 and the portion 115 of the loop filter of FIG. 1. A second integrator is an active Gm-C integrator that drives a third active-RC integrator. The active-RC integrator allows capacitive feed-forwards (e.g., $C_3/C_{f3}$, $C_3/C_{f2}$). As shown in FIG. 1, capacitor C (e.g., 110 of FIG. 1) may be coupled to a transconductance amplifier (e.g., 135 of FIG. 1) and collectively form a first Gm-C integrator. Outputs $V_{op}$ and $V_{om}$ of the loop filter 400 may be provided to a quantizer, such as the quantizer 120. Although the loop filter 400 is a third-order loop filter, lower order or higher order loop filters may be utilized. A higher-order loop filter is generally associated with more noise shaping.

Figure 5:
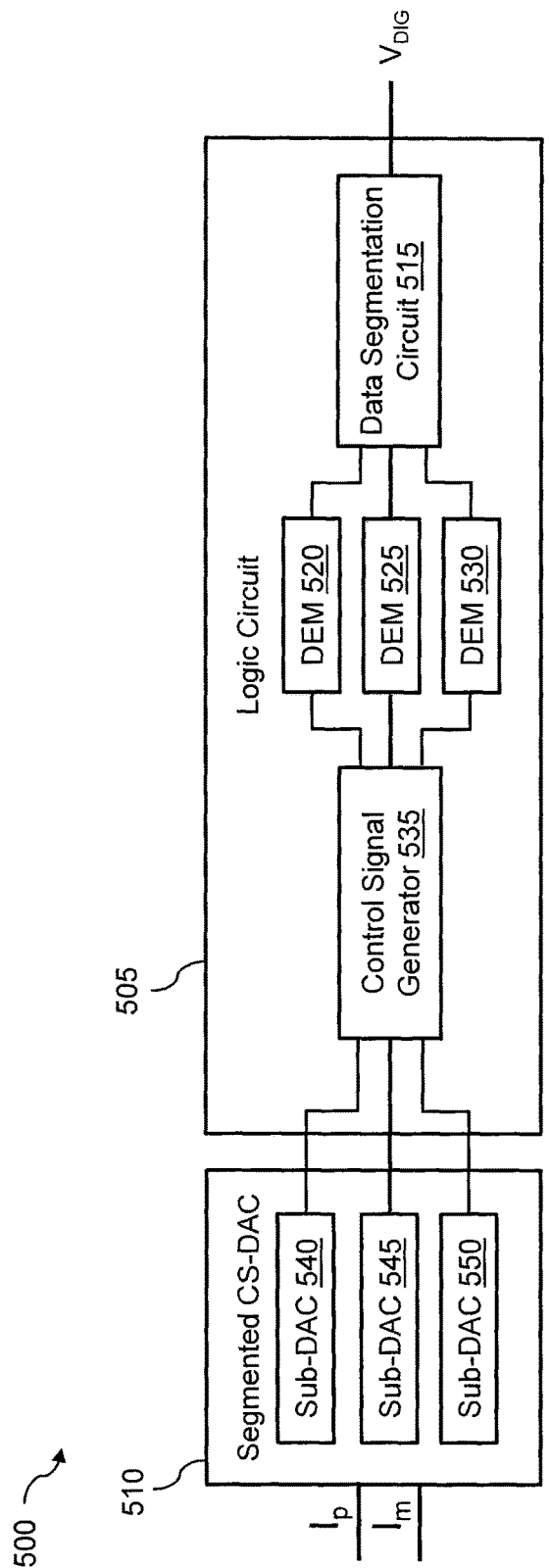
FIG. 5 illustrates an example of a feedback path of an audio processing system in accordance with one or more embodiments of the present disclosure.

FIG. 5 illustrates an example of a feedback path 500 of an audio processing system in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components. In an embodiment, the audio processing system may be the audio processing system 100 of FIG. 1. For explanatory purposes, the feedback path 500 connects to the quantizer 120 and the capacitor 110. However, the feedback path 500 may be used with other audio processing systems.

The feedback path 500 includes a logic circuit 505 and a segmented CS DAC 510. The logic circuit 505 includes a data segmentation circuit 515 that splits an N-bit signal from the quantizer 120 into three data segments. DEM circuits 520, 525, and 530 of the logic circuit 505 may perform DEM on a first, second, and third data segment, respectively. For example, each of the DEM circuits 520, 525, and 530 may shuffle its respectively data segment. The DEM circuits 520, 525, and 530 may provide its output to a control signal generator 535 of the logic circuit 505. The logic circuit 505 may generate control signals to effectuate control of sub-DACs 540, 545, and 550 of the segmented CS DAC 510. In some cases, the control signals for the sub-DACs 540, 545, and 550 may be based on an output of the DEM circuits 520, 525, and 530, respectively. The sub-DACs 540, 545, and 550 may have unit elements to contribute a positive current, negative current, or no current to the output $I_p$ and/or $I_m$ lines. In some cases, the sub-DACs 540, 545, and 550 may have different weights applied to their unit elements. For example, the sub-DAC 540 may be set to have a weight of sixteen and thus contributes $-16I_u$, $+16I_u$, or zero current to the output $I_p$ and/or $I_m$ lines. The sub-DACs 545 and 550 may be set to have a weight of four and one, respectively.

In FIG. 5, the data segmentation circuit 515 may segment the N-bit signal into three data segments, with a corresponding DEM circuit and sub-DAC applied to one of the three data segments. As an example, the data segmentation circuit 515 may provide a three-way data segmentation to generate a first data segment having 4 bits, second data segment having 3 bits, and third data segment having 3 bits. Such segmentation is provided by way of non-limiting example only, and a different number of data segments and/or different number of bits for the data segments may be utilized.

Figure 6:
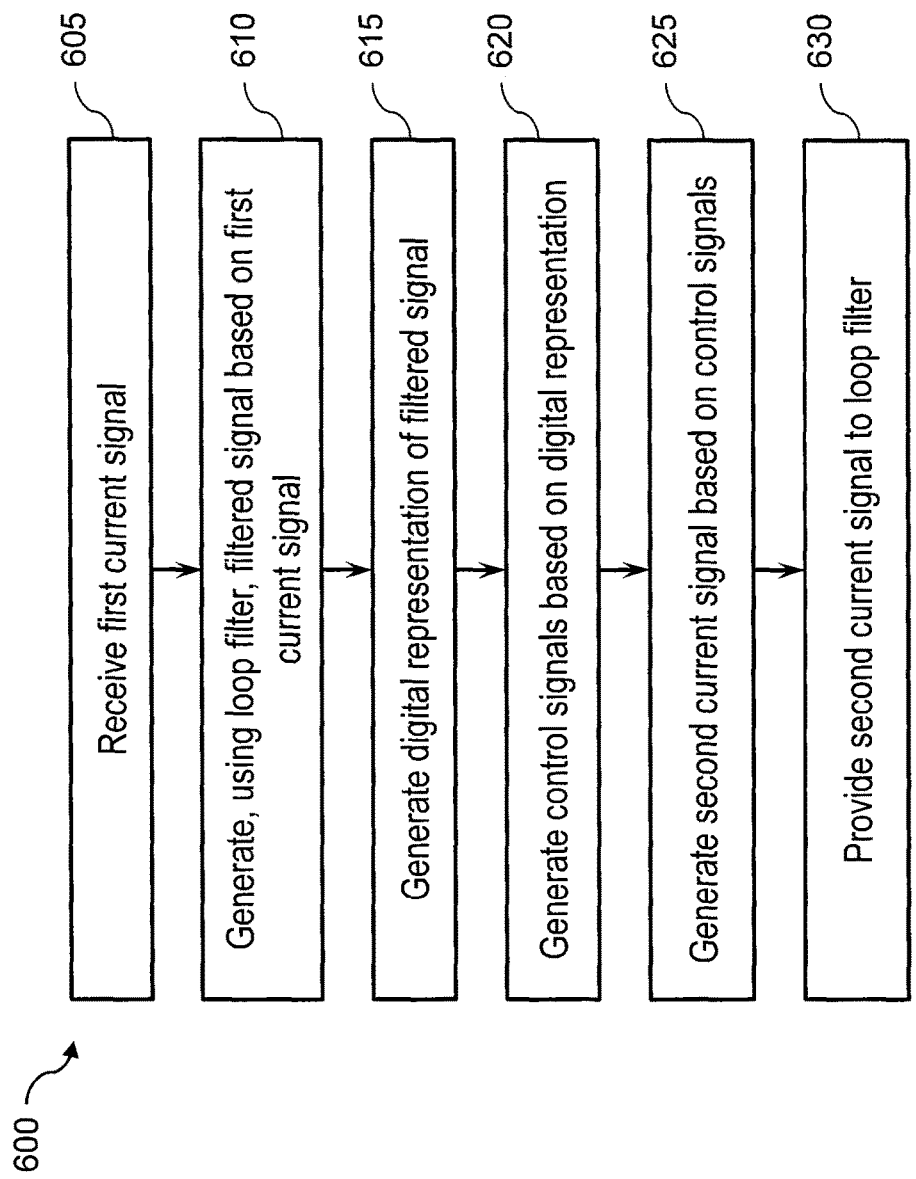
FIG. 6 illustrates a flow diagram of an example process for facilitating analog-to-digital conversion in accordance with one or more embodiments of the present disclosure.

FIG. 6 illustrates a flow diagram of an example process 600 for facilitating analog-to-digital conversion in accordance with one or more embodiments of the present disclosure. For explanatory purposes, the example process 600 is described herein with reference to the audio processing system 100 of FIG. 1, although the example process 600 may be utilized with other systems. Note that one or more operations may be combined, omitted, and/or performed in a different order as desired.

At block 605, the ADC 105 receives an input signal (e.g., a current signal). The input signal may be a current signal from the transconductance amplifier 135. For example, an audio signal (e.g., a voltage signal) may be provided by an audio input device, such as the microphone 140, to the transconductance amplifier 135, and the transconductance amplifier 135 may generate the current signal based on the audio signal. In some cases, the current signal generated by the transconductance amplifier 135 may be a differential current. At block 610, the loop filter of the ADC 105 generates a filtered signal $V_{LF}$ based on the input signal. In an aspect, the loop filter may receive, from the subtractor 145, a difference between the current signal from the transconductance amplifier 135 and a current signal from the DAC 130, and may filter this difference signal to generate the filtered signal $V_{LF}$. In some cases, the filtering by the loop filter may include noise shaping this difference signal. In some cases, the transconductance amplifier 135 may be considered a part of the loop filter of the ADC 105. The transconductance amplifier 135 and the capacitor 110 of the ADC 105 may form an integrator (e.g., a first integrator in some cases) of the loop filter of the ADC 105. At block 615, the quantizer 120 generates an N-bit digital representation $V_{DIG}$ of the filtered signal $V_{LF}$. In some cases, the N-bit digital representation $V_{DIG}$ may be provided to the logic circuit 125 for feedback of the ADC 105 and for further processing and/or storage by one or more components outside of the ADC 105.

At block 620, the logic circuit 125 generates control signals based on the N-bit digital representation $V_{DIG}$. In some cases, the logic circuit 125 may perform data segmentation on the N-bit digital representation to split the N-bit digital representation into multiple data segments, where each data segment corresponds to a subset of three-level unit elements of the DAC 130. Alternatively or in addition, the logic circuit 125 may perform DEM on the N-bit digital representation or perform DEM on data segments formed from the N-bit digital representation. At block 625, the DAC 130 generates a current signal based on the control signals. In some cases, each three-level element of the DAC 130 can provide a positive current, a negative current, or no current. At block 630, the DAC 130 provides the generated current signal to the loop filter of the ADC 105. For example, the DAC 130 may provide a differential current on the output lines $I_p$ and $I_m$ to the subtractor 145 of the loop filter.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. An analog-to-digital conversion (ADC) system comprising:
    a transconductance amplifier configured to generate a current signal in response to an audio signal received from an audio input device;
    a loop filter connected to the transconductance amplifier, wherein the loop filter is configured to receive the current signal and generate a filtered signal based on the current signal;
    a quantizer configured to generate a digital representation of the filtered signal;
    a logic circuit comprising:
        a dynamic element matching circuit configured to receive the digital representation and perform data shuffling on the digital representation to obtain a shuffled version of the digital representation; and
        a control signal generator configured to generate control signals based on the shuffled version of the digital representation; and
    a digital-to-analog converter (DAC) coupled to a capacitor of the loop filter and an output of the transconductance amplifier, wherein the DAC comprises a plurality of three-level unit elements, wherein each of the plurality of three-level unit elements is configured to provide one of three signal levels to the loop filter in response to at least one of the control signals from the logic circuit, and wherein at least one of the plurality of three-level unit elements is configured to provide a zero signal level.

2. The ADC system of claim 1, wherein the three signal levels comprise a positive signal level, a negative signal level, and the zero signal level.

3. The ADC system of claim 1, wherein each of the plurality of three-level unit elements comprises a respective plurality of current sources.

4. The ADC system of claim 1, wherein the DAC comprises a current steering DAC.

5. The ADC system of claim 1, wherein the quantizer comprises a mid-tread quantizer.

6. The ADC system of claim 1, wherein:
    the loop filter comprises a subtractor configured to generate a difference between the current signal and an output signal of the DAC,
    the subtractor is connected to the DAC, capacitor, and output of the transconductance amplifier, and
    the loop filter is configured to filter the difference to generate the filtered signal.

7. The ADC system of claim 1, wherein the audio input device is a microphone.

8. The ADC system of claim 1, wherein the quantizer comprises a successive-approximation-register (SAR) ADC.

9. An analog-to-digital conversion (ADC) system comprising:
    a transconductance amplifier configured to generate a current signal in response to an audio signal received from an audio input device;
    a loop filter connected to the transconductance amplifier, wherein the loop filter is configured to receive the current signal and generate a filtered signal based on the current signal;
    a quantizer configured to generate a digital representation of the filtered signal;
    a logic circuit comprising:
        a data segmentation circuit configured to split the digital representation into a plurality of data segments; and
        a control signal generator configured to generate control signals based on the plurality of data segments, wherein each control signal is associated with one of the plurality of data segments; and
    a digital-to-analog converter (DAC) coupled to a capacitor of the loop filter and an output of the transconductance amplifier, wherein the DAC comprises a plurality of three-level unit elements, wherein each of the plurality of three-level unit elements is configured to provide one of three signal levels to the loop filter in response to at least one of the control signals from the logic circuit, and wherein at least one of the plurality of three-level unit elements is configured to provide a zero signal level.

10. The ADC system of claim 9, wherein:
    the DAC comprises a plurality of sub-DACs,
    each of the plurality of sub-DACs is associated with one of the plurality of data segments, and
    each of the plurality of sub-DACs comprises a respective subset of the plurality of three-level unit elements configured to be controlled by a corresponding subset of the control signals.

11. The ADC system of claim 9, wherein the logic circuit further comprises a dynamic element matching circuit configured to perform data shuffling on each of the plurality of data segments to obtain a shuffled version of each data segment, and wherein each control signal is associated with one of the shuffled versions.

12. The ADC system of claim 9, wherein the DAC comprises a current steering DAC, and wherein each of the plurality of three-level unit elements comprises a respective plurality of current sources.

13. The ADC system of claim 9, wherein the quantizer comprises a mid-tread quantizer.

14. A method comprising:
    generating, by a transconductance amplifier, a first current signal in response to an audio signal received from an audio input device;
    generating, by a loop filter, a filtered signal based on the first current signal;
    generating, by a quantizer, a digital representation of the filtered signal;
    shuffling, by a dynamic element matching circuit, the digital representation to obtain a shuffled version of the digital representation;
    generating, by a control signal generator, a set of control signals based on the shuffled version of the digital representation;
    generating, by a digital-to-analog converter (DAC), a second current signal based on the set of control signals, wherein each of a plurality of three-level unit elements provides one of three current levels to the loop filter in response to at least one control signal of the set of control signals, wherein at least one of the plurality of three-level unit elements provides a zero current level, and wherein the DAC is coupled to a capacitor of the loop filter and an output of the transconductance amplifier; and providing, by the DAC, the second current signal to the loop filter.

15. The method of claim 14, wherein the quantizer comprises a mid-tread quantizer.

16. The method of claim 14, wherein the three current levels comprise a positive current level, a negative current level, and the zero current level.

17. The method of claim 14, further comprising:

receiving a second audio signal from the audio input device;

generating, by the transconductance amplifier, a third current signal based on the second audio signal;

generating a fourth current signal based on the third current signal and the second current signal from the DAC;

generating, by the loop filter, a second filtered signal based on the fourth current signal;

generating, by the quantizer, a digital representation of the second filtered signal;

generating, by the control signal generator, a second set of control signals based on the digital representation of the second filtered signal;

generating, by the DAC, a fifth current signal based on the second set of control signals; and providing the fifth current signal to the loop filter.

18. The method of claim 17, wherein generating the fourth current signal comprises determining a difference between the third current signal and the second current signal to determine the fourth current signal.

19. The method of claim 14, wherein the audio input device is a microphone.

20. The method of claim 14, further comprising:

splitting the digital representation into a plurality of data segments, wherein:

each control signal is associated with one of the plurality of data segments, the DAC comprises a plurality of sub-DACs, and each of the plurality of sub-DACs comprises a respective subset of the plurality of three-level unit elements controlled by a corresponding subset of the set of control signals.

* * * * *